US011932961B2

(12) United States Patent
Yang et al.

(10) Patent No.: US 11,932,961 B2
(45) Date of Patent: Mar. 19, 2024

(54) ASSEMBLY SLEEVE OF SINGLE CRYSTAL PULLING APPARATUS, AND SINGLE CRYSTAL PULLING APPARATUS

(71) Applicants: Xi'an ESWIN Material Technology Co., Ltd., Xi'an (CN); Xi'an ESWIN Silicon Wafer Technology Co., Ltd., Xi'an (CN)

(72) Inventors: Wenwu Yang, Xi'an (CN); Bokcheol Sim, Xi'an (CN)

(73) Assignees: XIAN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 182 days.

(21) Appl. No.: 17/627,717

(22) PCT Filed: Jun. 23, 2021

(86) PCT No.: PCT/CN2021/101805
§ 371 (c)(1),
(2) Date: Jan. 17, 2022

(87) PCT Pub. No.: WO2022/033187
PCT Pub. Date: Feb. 17, 2022

(65) Prior Publication Data
US 2022/0356598 A1 Nov. 10, 2022

(30) Foreign Application Priority Data
Aug. 10, 2020 (CN) .......................... 202010795735.3

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01)

(58) Field of Classification Search
CPC .... C30B 15/10; C30B 29/06; Y10T 117/1068
See application file for complete search history.

(56) References Cited

U.S. PATENT DOCUMENTS 5,824,152 A * 10/1998 Kubota ................... C30B 15/14
117/34
2002/0134302 A1 * 9/2002 Ferry ...................... C30B 15/14
117/213
(Continued)

FOREIGN PATENT DOCUMENTS

CN 101037794 A 9/2007
CN 105239150 A 1/2016
(Continued)

OTHER PUBLICATIONS

Japanese Office Action corresponding to Japanese Patent Application No. 2022538788, dated Jul. 25, 2023. (4 pages).
(Continued)

*Primary Examiner* — Robert M Kunemund
(74) *Attorney, Agent, or Firm* — Maginot, Moore & Beck LLP

(57) ABSTRACT

An assembly sleeve of a single crystal pulling apparatus, and the single crystal pulling apparatus are provided. The assembly sleeve includes inner and outer cylinders and a bottom cylinder. The outer cylinder is provided with openings at both ends and sleeved onto the inner cylinder. The bottom cylinder is arranged at the opening at a lower end of the outer cylinder, and includes an annular plate and a lower cylinder. Each of the inner lower cylinders is of an inverted-cone shape, an upper end of the inner cylinder is connected to an upper end of the outer cylinder, an outer edge of the annular plate is hermetically connected to the lower end of the outer (Continued)

cylinder, an inner edge of the annular plate is connected to an upper end of the lower cylinder, and a lower end of the inner cylinder is fixedly connected to an upper surface of the annular plate.

12 Claims, 3 Drawing Sheets

(56) References Cited

U.S. PATENT DOCUMENTS

| | | | | |
|---|---|---|---|---|
| 2004/0055531 | A1* | 3/2004 | Ferry | C30B 15/14 117/217 |
| 2007/0151505 | A1 | 7/2007 | Cho et al. | |
| 2008/0053372 | A1* | 3/2008 | Anttila | C30B 15/14 117/200 |
| 2010/0288185 | A1* | 11/2010 | Filar | C30B 29/06 117/217 |
| 2012/0000416 | A1* | 1/2012 | Wang | C30B 15/14 165/185 |
| 2013/0247815 | A1* | 9/2013 | Sugawara | C30B 29/06 117/217 |
| 2017/0107639 | A1* | 4/2017 | Basak | C30B 15/206 |

FOREIGN PATENT DOCUMENTS

| | | |
|---|---|---|
| CN | 207944172 U | 10/2018 |
| CN | 109930197 A | 6/2019 |
| CN | 110387577 A | 10/2019 |
| CN | 110904498 A | 3/2020 |
| CN | 211112314 U | 7/2020 |
| CN | 111876823 A | 11/2020 |
| JP | H07172971 A | 7/1995 |
| JP | 2007182373 A | 7/2007 |
| KR | 20090062144 A | 6/2009 |
| WO | 2014178627 A1 | 11/2014 |

OTHER PUBLICATIONS

English Translation of Japanese Office Action corresponding to Japanese Patent Application No. 2022538788, dated Jul. 25, 2023. (4 pages).
Korean Office Action corresponding to Korean Application No. 10-2021-7037495, dated Jun. 20, 2023. (5 Pages).
English Translation of Korean Office Action corresponding to Korean Application No. 10-2021-7037495, dated Jun. 20, 2023. (5 Pages).
Machine English Translation of KR20090062144A. (10 Pages).
Machine English Translation of JPH07172971A. (6 Pages).
Written Opinion and International Search Report of the International Search Authority corresponding to International Application No. PCT/CN2021/101805, dated Aug. 5, 2021. (10 pages).
English Translation of Written Opinion and International Search Report of the International Search Authority corresponding to International Application No. PCT/CN2021/101805, dated Aug. 5, 2021. (2 pages).
Chinese Office Action corresponding to Chinese Application No. 202010795735.3, dated May 7, 2021. (7 Pages).
English Translation of Chinese Office Action corresponding to Chinese Application No. 202010795735.3, dated May 7, 2021. (6 Pages).
Machine Translation of CN111876823A. (9 Pages).
English Translation of WO2014178627A1. (13 Pages).
Machine Translation of CN101037794A. (19 Pages).
Machine Translation of CN110387577A. (23 Pages).
Machine Translation of CN105239150A. (18 Pages).
Machine Translation of CN109930197A. (16 Pages).
Machine Translation of CN110904498A. (18 Pages).
Machine Translation of CN207944172U. (8 Pages).
Machine Translation of CN211112314U. (13 Pages).
German Office Action corresponding to German Patent Application No. 11 2021 000 109.4, dated Oct. 18, 2023. (4 pages).
English Translation of German Office Action corresponding to German Patent Application No. 11 2021 000 109.4, dated Oct. 18, 2023. (3 pages).

\* cited by examiner

ASSEMBLY SLEEVE OF SINGLE CRYSTAL PULLING APPARATUS, AND SINGLE CRYSTAL PULLING APPARATUS

CROSS-REFERENCE TO RELATED APPLICATION

This application is the U.S. national phase of PCT Application No. PCT/CN2021/101805 filed on Jun. 23, 2021, which claims a priority of the Chinese patent application No. 202010795735.3 filed in China on Aug. 10, 2020, which are incorporated herein by reference in their entireties.

TECHNICAL FIELD

The present disclosure relates to the preparation of an ingot, in particular to an assembly sleeve of a single crystal pulling apparatus, and the single crystal pulling apparatus.

BACKGROUND

Along with the development in the manufacture process of the microelectronic industry, quality of a silicon wafer is highly demanded, so it is necessary to control crystal defects in an ingot. There mainly exist two kinds of crystal defects in the ingot. One of them refers to defects caused by supersaturated interstitial aggregation, and Gate Oxide Integrity (GOI) of a Metal Oxide Semiconductor (MOS) element is not adversely affected by this kind of defect. The other of them refers to defects caused by vacancy aggregation, and this kind of growth defect affect product yield related to GOI. Common vacancy defects include Crystal Originated Particles (COPs), Flow Pattern Defects (FPD), and Laser Scattering Tomography Defects (LSTDs). The generation of these defects is associated with an axial temperature gradient G of the ingot, and the axial temperature gradient G is varied in accordance with a design of a Hot-Zone.

In the Hot-Zone, the design of a heat shield is crucial, and it directly influences the axial temperature gradient G of the ingot as well as a difference ΔG between an axial temperature gradient at an edge of the ingot and an axial temperature gradient at the center of the ingot, and thereby influences the kinds and distribution of the defects in the ingot. In a crystal pulling process, due to the limitation of the heat shield in the related art, a huge amount of heat at a melt surface is transferred to a surface of the ingot, leading to the decrease of axial temperature gradient at the edge of the ingot. At this time, the axial temperature different at the center of the ingot substantially has not been affected, so the ΔG is increased. Depending on a V/G theory, at this time the vacancy defects gather and grow up, so a region where ingot growth with defect-free is decreased, i.e., it is adverse to the defect-free growth of the ingot.

SUMMARY

In view of the above, an object of the present disclosure is to provide an assembly sleeve of a single crystal pulling apparatus, and the single crystal pulling apparatus, so as to solve problems in the related art where the kinds and distribution of the defects in the ingot, and thereby the defect-free growth of the ingot, are adversely affected as the design of heat shield is inappropriate.

In order to solve the above-mentioned problem, the present disclosure provides the following technical solutions.

In one aspect, the present disclosure provides in some embodiments an assembly sleeve of a single crystal pulling apparatus, including an inner cylinder, an outer cylinder and a bottom cylinder. The outer cylinder is provided with openings at both ends of the outer cylinder and sleeved onto the inner cylinder. The bottom cylinder is arranged at the opening at a lower end of the outer cylinder, and includes an annular plate and a lower cylinder. Each of the inner cylinder and the lower cylinder is of an inverted-cone shape, an upper end of the inner cylinder is connected to an upper end of the outer cylinder, an outer edge of the annular plate is hermetically connected to the lower end of the outer cylinder, an inner edge of the annular plate is connected to an upper end of the lower cylinder, and a lower end of the inner cylinder is fixedly connected to an upper surface of the annular plate.

In a possible embodiment of the present disclosure, each of the inner cylinder and the outer cylinder is made of graphite.

In a possible embodiment of the present disclosure, each of the annular plate and the lower cylinder is made of molybdenum.

In a possible embodiment of the present disclosure, a first filler and a second filler are provided in a chamber defined by the inner cylinder, the outer cylinder and the annular plate, the first filler is arranged above the second filler, the first filler is made of a thermally conductive material, and the second filler is made of a thermal insulation material.

In a possible embodiment of the present disclosure, the annular plate is formed integrally with the lower cylinder.

In a possible embodiment of the present disclosure, a first thread is formed at the outer edge of the annular plate, a second thread is formed at the lower end of the outer cylinder, and the annular plate is in threaded connection with the outer cylinder through the first thread and the second thread.

In a possible embodiment of the present disclosure, a bottom surface of the annular plate is a circular conical surface.

In another aspect, the present disclosure provides in some embodiments a single crystal pulling apparatus including the above-mentioned assembly sleeve.

The present disclosure has the following beneficial effects.

According to the assembly sleeve in the embodiments of the present disclosure, it is able to maintain a junction among solid, liquid and gas phases at a surface of silicon melt at a certain position, and maintain a stable temperature field, thereby to facilitate the defect-free growth of an ingot. In addition, after the surface of the silicon melt has exceeded a predetermined level, it is able to accelerate the cooling of the ingot, and help the ingot to rapidly pass through a temperature range where the defect generates and grows, thereby to finally acquire the high-quality ingot.

DETAILED DESCRIPTION

In order to make the objects, the technical solutions and the advantages of the present disclosure more apparent, the present disclosure will be described hereinafter in a clear manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
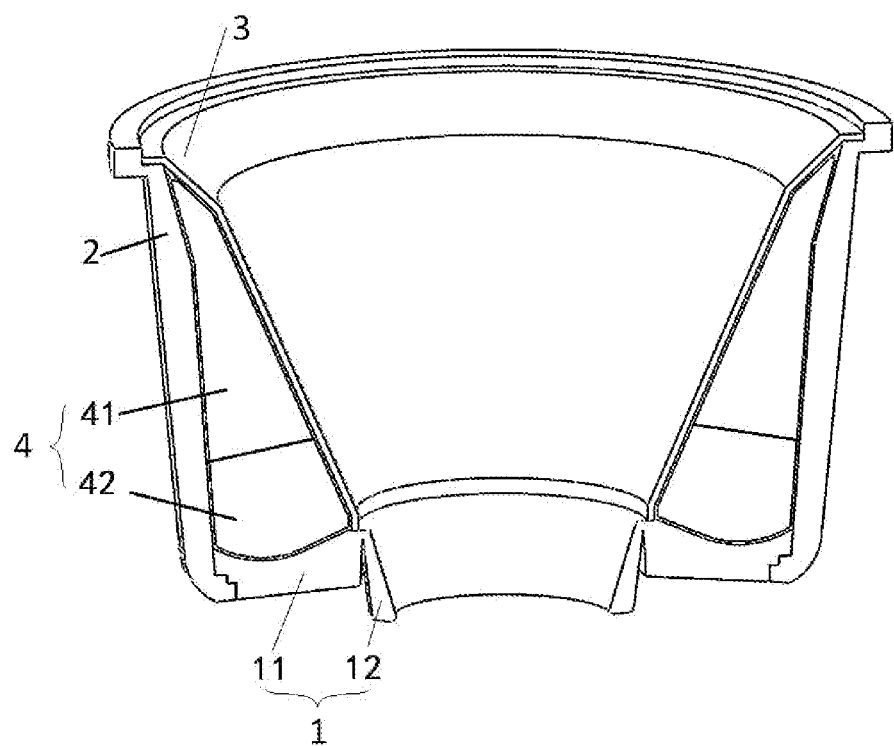
FIG. 1 is a schematic view of an assembly sleeve according to an embodiment of the present disclosure.
Figure 2:
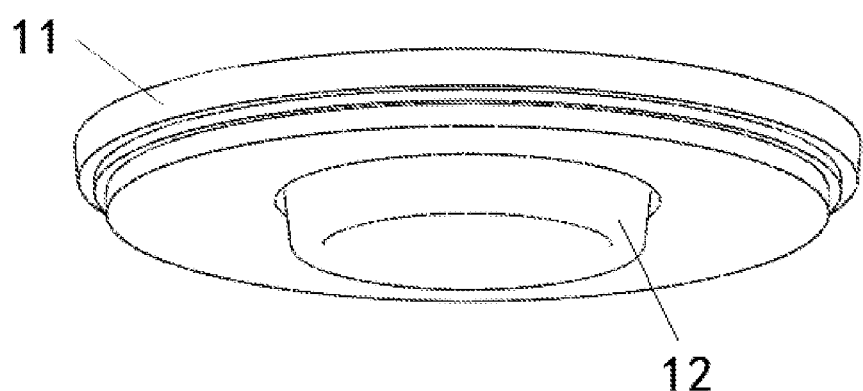
FIG. 2 is a schematic view showing a bottom cylinder according to an embodiment of the present disclosure.
Figure 3:
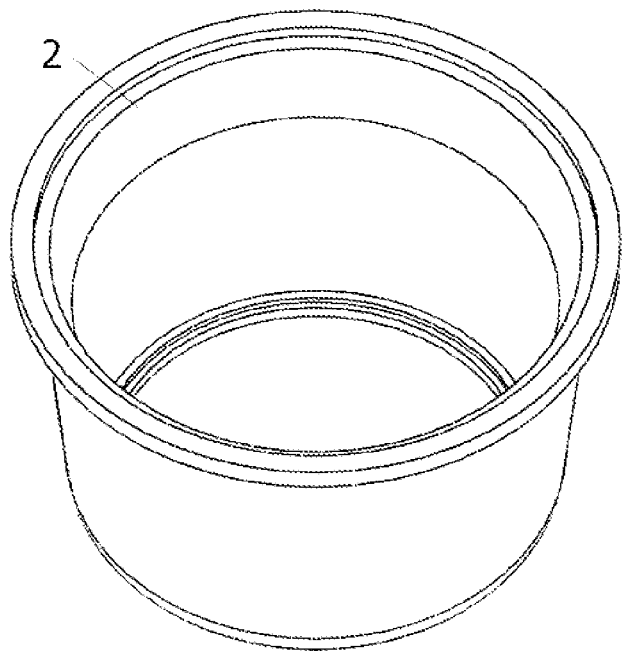
FIG. 3 is a schematic view showing an outer cylinder according to an embodiment of the present disclosure.
Figure 4:
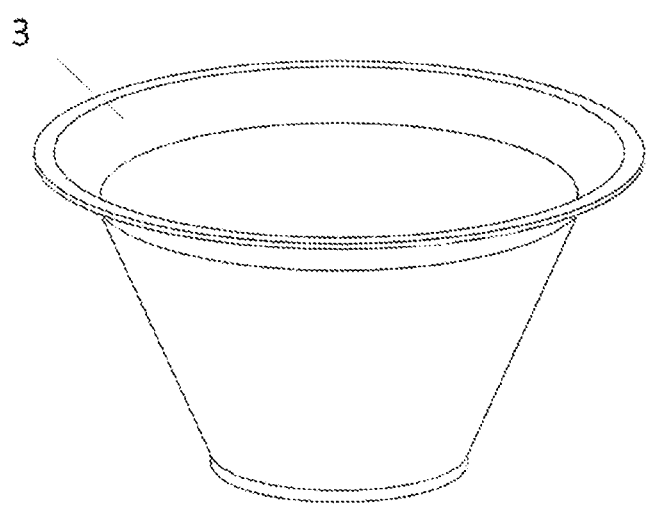
FIG. 4 is a schematic view showing an inner cylinder according to an embodiment of the present disclosure.

FIG. 1 is a schematic view showing an assembly sleeve according to an embodiment of the present disclosure, FIG. 2 is a schematic view showing a bottom cylinder according to an embodiment of the present disclosure, FIG. 3 is a schematic view showing an outer cylinder according to an embodiment of the present disclosure, and FIG. 4 is a schematic view showing an inner cylinder according to an embodiment of the present disclosure. As shown in FIGS. 1 to 4, the assembly sleeve includes the bottom cylinder 1, the outer cylinder 2 and the inner cylinder 3. The outer cylinder 2 is hollow, provided with openings at two ends, and sleeved onto the inner cylinder 3. The bottom cylinder 1 is arranged at the opening at a lower end of the outer cylinder. To be specific, the bottom cylinder 1 includes an annular plate 11 and a lower cylinder 12. Each of the inner cylinder 3 and the lower cylinder 12 is of an inverted-cone shape, and provided with openings at both ends. An upper end of the inner cylinder 3 is connected to an upper end of the outer cylinder 2, and a size of the upper end of the inner cylinder 3 is slightly smaller than a size of the opening at the upper end of the outer cylinder 2, so that the inner cylinder 3 is arranged inside the outer cylinder 2. The upper end of the inner cylinder 3 is lapped onto, or fixedly connected via a bolt to, the upper end of the outer cylinder 2, i.e., a specific connection mode will not be particularly further defined herein. An outer edge (i.e., a periphery) of the annular plate 11 is hermetically connected to the lower end of the outer cylinder 2, an inner edge of the annular plate 11 is connected to an upper end of the lower cylinder 12, and a lower end of the inner cylinder 3 is fixedly connected to an upper surface of the annular plate 11. Since the inner cylinder 3 is of the inverted-cone shape, a contact point between the lower end of the inner cylinder 3 and the upper surface of the annular plate 11 is close to the inner edge of the annular plate 11.

In the embodiments of the present disclosure, a first thread is formed at the outer edge of the annular plate 11, a second thread is formed at the lower end of the outer cylinder 2, and the annular plate 11 is in threaded connection with the outer cylinder 2 through the first thread and the second thread, so as to facilitate the disengagement of the bottom cylinder 1 from the outer cylinder 2. In addition, it is able to achieve firm connection between the bottom cylinder 1 and the outer cylinder 2, thereby to prevent the connection from being loosened due to the blowing of an inert gas.

Figure 5:
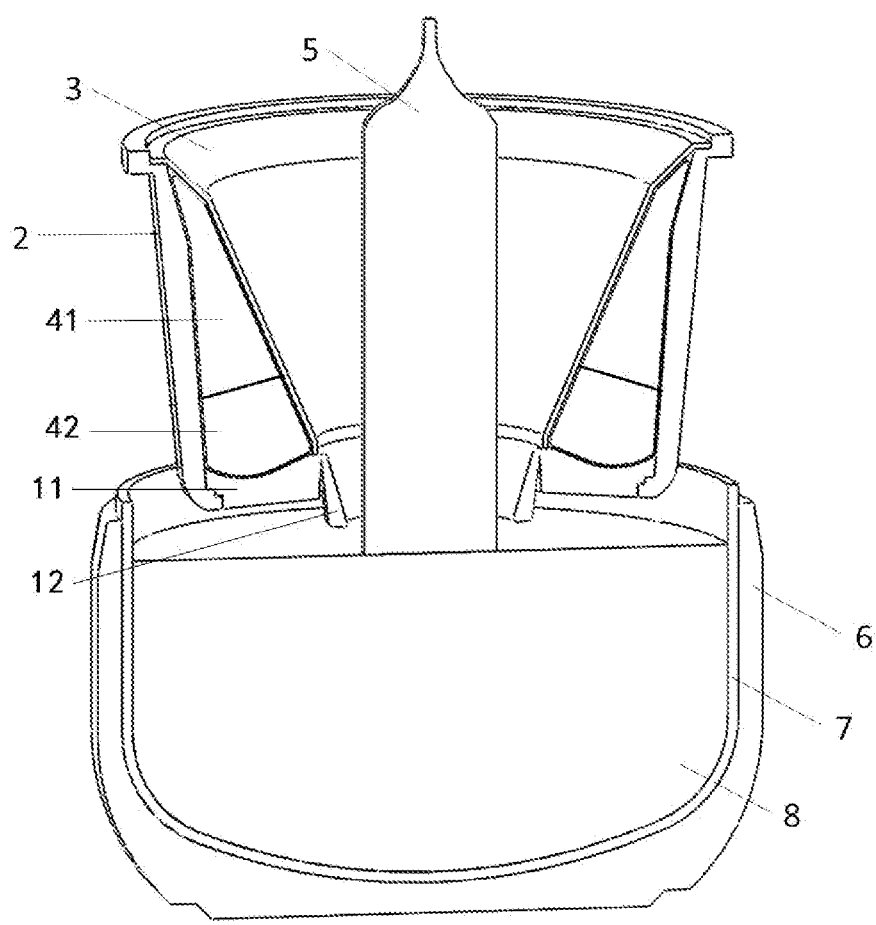
FIG. 5 is a schematic view showing the use of the assembly sleeve according to an embodiment of the present disclosure.

FIG. 5 is a schematic view showing the use of the assembly sleeve according to an embodiment of the present disclosure. As shown in FIG. 5, in use, the assembly sleeve is arranged above silicon melt. A gas flow channel is defined by the inner cylinder 3 and the lower cylinder 12 of the assembly sleeve, and the inert gas is guided by the inner cylinder 3 and the lower cylinder 12 to a surface of the silicon melt 8. In a procedure of pulling a seed for the growth of an ingot 5, the ingot 5 is cooled rapidly by the inert gas. In the embodiments of the present disclosure, the bottom cylinder 1 is made of a reflective thermal insulation material, and more particularly molybdenum. Through the above design, it is able to achieve heat preservation for an interior of the lower cylinder 12 of the bottom cylinder 1, maintain a junction among solid, liquid and gas phases of the silicon melt 8 at a certain position, and maintain a stable temperature field. In addition, since the lower cylinder 12 is of an inverted-cone shape, it is able to availably control a difference ΔG between an axial temperature gradient at an edge of the ingot 5 and an axial temperature gradient at the center of the ingot 5, and enable the difference ΔG to approach to an ideal value, thereby to facilitate the defect-free growth of the ingot 5. The bottom cylinder 1 made of molybdenum is capable of effectively reflecting heat from a liquid surface, so it is able to maintain a stable temperature field at the surface of, and in proximity to, the silicon melt 8. In a possible embodiment of the present disclosure, a bottom surface of the annular plate 11 of the bottom cylinder 1 is a circular conical surface. In other words, a distance between the bottom surface of the annular plate 11 and the surface of the silicon melt 8 gradually increases from the outer edge to the inner edge, so as to enable the annular plate 11 to reflect the heat from the melt surface to a junction of the solid phase, i.e., the ingot 5, and the liquid phase, i.e., the silicon melt 8, thereby to ensure a stable temperature. Through the lower cylinder 12 of the bottom cylinder, it is able to maintain the part of the ingot 5 passing through the lower cylinder 12 in a constant temperature range, form a stable temperature field at a corresponding position of the bottom cylinder 1, and maintain a constant axial temperature gradient G of the ingot 5, thereby to facilitate the defect-free growth of the ingot 5 at the position.

In the embodiments of the present disclosure, each of the inner cylinder 3 and the outer cylinder 2 is made of a thermally conductive material, and more particularly graphite. When the inner cylinder 3 and the outer cylinder 2 are made of the thermally conductive material, it is able to rapidly cool the part of ingot 5 inside the inner cylinder 3 at a corresponding position, i.e., to rapidly dissipate the heat from a part of the ingot 5 inside the inner cylinder 3 to the outside through the inner cylinder 3 and the outer cylinder 2, and enable the ingot 5 to rapidly pass through a temperature range where the defect generates and grows, thereby to effectively suppress the growth of the defect in the ingot 5.

In the embodiments of the present disclosure, a filler 4 is provided in a chamber configured by the inner cylinder 3, the outer cylinder 2 and the annular plate 11. The filler 4 includes a first filler 41 and a second filler 42. The first filler 41 is arranged above the second filler 42, and made of a thermally conductive material. The second filler 42 is made of a thermal insulation material. In other words, the chamber configured by the inner cylinder 3, the outer cylinder 2 and the annular plate 11 is divided into two parts. The first filler 41 is filled in an upper part of the chamber where the ingot 5 needs to be rapidly cooled, thereby the first filler 41 which made of the thermally conductive material cooperated with the inner cylinder 3 and the outer cylinder 2 made of graphite, it is able to rapidly transfer the heat from the ingot 5 to the outside. The second filler 42 is filled in a lower part of the chamber where the ingot 5 needs to be maintained at a constant temperature range, so the second filler 42 made of the thermal insulation material is able to block the heat transfer from bottom to top and from inside to outside, thereby to reduce the heat dissipation.

In the embodiments of the present disclosure, the annular plate 11 is formed integrally with the lower cylinder 12, so as to prevent the relative movement between them, thereby to detect the position of surface of the silicon melt 8 accurately.

According to the assembly sleeve in the embodiments of the present disclosure, it is able to maintain a junction among solid, liquid and gas phases at the surface of silicon melt at a certain position, and maintain a stable temperature field, thereby to facilitate growth of an ingot with defect-free. In addition, after it has exceeded the surface of the silicon melt a predetermined level, it is able to accelerate the cooling of the ingot, and help the ingot to rapidly pass through a temperature range where the defect generates and grows, thereby to finally acquire the high-quality ingot.

The present disclosure further provides in some embodiments a single crystal pulling apparatus which provided the above-mentioned assembly sleeve. According to the assembly sleeve in the embodiments of the present disclosure, it is able to maintain a junction among solid, liquid and gas phases at the surface of silicon melt at a certain position, and maintain a stable temperature field, thereby to facilitate the defect-free growth of an ingot. In addition, after the surface of the silicon melt has exceeded a predetermined level, it is able to accelerate the cooling of the ingot, and help the ingot to rapidly pass through a temperature range where the defect generates and grows, thereby to finally acquire the high-quality ingot. Hence, the single crystal pulling apparatus in the embodiments of the present disclosure also has the above-mentioned beneficial effects, which will not be particularly defined herein.

As shown in FIG. 5, in a possible embodiment of the present disclosure, the single crystal pulling apparatus includes a crucible component and the assembly sleeve arranged right above the crucible component. The crucible component includes a graphite crucible 6 and a quartz crucible 7, and the silicon melt 8 is received in the quartz crucible. The assembly sleeve is spaced apart from the surface of the silicon melt 8 by a certain distance, and a size of the opening at the lower end of the lower cylinder 12 in the assembly sleeve is slight greater than a diameter of the ingot 5, so as to allow the ingot 5 to pass therethrough.

While the foregoing is only part of embodiments of the present disclosure, it should be understood by those skilled in the art that various improvements and modifications may be made without departing from the principle of the present disclosure, and these improvements and modifications shall also fall within the scope of protection of the present disclosure.

What is claimed is:

1. An assembly sleeve of a single crystal pulling apparatus, comprising:
   an inner cylinder, an outer cylinder and a bottom cylinder, wherein the outer cylinder is provided with openings at both ends of the outer cylinder and sleeved onto the inner cylinder;
   wherein the bottom cylinder is arranged at the opening at a lower end of the outer cylinder, and comprises an annular plate and a lower cylinder;
   wherein each of the inner cylinder and the lower cylinder is of an inverted-cone shape, an upper end of the inner cylinder is connected to an upper end of the outer cylinder, an outer edge of the annular plate is hermetically connected to the lower end of the outer cylinder, an inner edge of the annular plate is connected to an upper end of the lower cylinder, and a lower end of the inner cylinder is fixedly connected to an upper surface of the annular plate; and
   wherein a first filler and a second filler are provided in a chamber defined by the inner cylinder, the outer cylinder and the annular plate, the first filler is arranged above the second filler, the first filler is made of a thermally conductive material, and the second filler is made of a thermal insulation material.

2. The assembly sleeve according to claim 1, wherein each of the inner cylinder and the outer cylinder is made of graphite.

3. The assembly sleeve according to claim 1, wherein each of the annular plate and the lower cylinder is made of molybdenum.

4. The assembly sleeve according to claim 1, wherein the annular plate is formed integrally with the lower cylinder.

5. The assembly sleeve according to claim 1, wherein a first thread is formed at the outer edge of the annular plate, a second thread is formed at the lower end of the outer cylinder, and the annular plate is in threaded connection with the outer cylinder through the first thread and the second thread.

6. The assembly sleeve according to claim 1, wherein a bottom surface of the annular plate is a circular conical surface.

7. A single crystal pulling apparatus, comprising:
   an assembly sleeve having an inner cylinder, an outer cylinder and a bottom cylinder, wherein the outer cylinder is provided with openings at both ends of the outer cylinder and sleeved onto the inner cylinder;
   wherein the bottom cylinder is arranged at the opening at a lower end of the outer cylinder, and comprises an annular plate and a lower cylinder;
   wherein each of the inner cylinder and the lower cylinder is of an inverted-cone shape, an upper end of the inner cylinder is connected to an upper end of the outer cylinder, an outer edge of the annular plate is hermetically connected to the lower end of the outer cylinder, an inner edge of the annular plate is connected to an upper end of the lower cylinder, and a lower end of the inner cylinder is fixedly connected to an upper surface of the annular plate; and
   wherein a first filler and a second filler are provided in a chamber defined by the inner cylinder, the outer cylinder and the annular plate, the first filler is arranged above the second filler, the first filler is made of a thermally conductive material, and the second filler is made of a thermal insulation material.

8. The single crystal pulling apparatus according to claim 7, wherein each of the inner cylinder and the outer cylinder is made of graphite.

9. The single crystal pulling apparatus according to claim 7, wherein each of the annular plate and the lower cylinder is made of molybdenum.

10. The single crystal pulling apparatus according to claim 7, wherein the annular plate is formed integrally with the lower cylinder.

11. The single crystal pulling apparatus according to claim 7, wherein a first thread is formed at the outer edge of the annular plate, a second thread is formed at the lower end of the outer cylinder, and the annular plate is in threaded connection with the outer cylinder through the first thread and the second thread.

12. The single crystal pulling apparatus according to claim 7, wherein a bottom surface of the annular plate is a circular conical surface.

* * * * *

UNITED STATES PATENT AND TRADEMARK OFFICE
CERTIFICATE OF CORRECTION

| | | |
|---|---|---|
| PATENT NO. | : 11,932,961 B2 | Page 1 of 1 |
| APPLICATION NO. | : 17/627717 | |
| DATED | : March 19, 2024 | |
| INVENTOR(S) | : Wenwu Yang et al. | |

It is certified that error appears in the above-identified patent and that said Letters Patent is hereby corrected as shown below:

On the Title Page

Under "(73) Assignees:":
Delete "XIAN ESWIN MATERIAL TECHNOLOGY CO., LTD., Xi'an (CN)", and
Insert --XI'AN ESWIN MATERIAL TECHNOLOGY CO., LTD., Xi'an (CN)--.

Signed and Sealed this
Thirty-first Day of December, 2024

Derrick Brent
*Acting Director of the United States Patent and Trademark Office*